United States Patent [19]

MacIver et al.

[11] 4,133,704
[45] Jan. 9, 1979

[54] METHOD OF FORMING DIODES BY AMORPHOUS IMPLANTATIONS AND CONCURRENT ANNEALING, MONOCRYSTALLINE RECONVERSION AND OXIDE PASSIVATION IN <100> N-TYPE SILICON

[75] Inventors: Bernard A. MacIver, Lathrup Village; Eugene Greenstein, Southfield, both of Mich.

[73] Assignee: General Motors Corporation, Detroit, Mich.

[21] Appl. No.: 759,903

[22] Filed: Jan. 17, 1977

[51] Int. Cl.$^2$ .......................................... H01L 21/265
[52] U.S. Cl. ...................................... 148/1.5; 148/187; 357/20; 357/91
[58] Field of Search .................... 148/1.5, 187; 357/91, 357/20

[56] References Cited

U.S. PATENT DOCUMENTS 3,589,949  6/1971  Nelson ................................. 148/1.5

OTHER PUBLICATIONS

H. Müller et al, ". . . Boron Doping of Si by Implantation of BF$_2^+$ –Molecules," Intn. Conf. on Ion–Impn., (1971), 85.

S. Prussin, "Impln. of B, F, BF and BF$_2$ into Si . . . ," *Ternary Defects*, p. 449.

A. E. Michel, et al. "Annealing . . . Ion–Implanted P–N Junctions in Si," Jour. Appl. Phys., 45 (1974), 2991.

K. E. Bean, et al., . . . "Crystal Orientation on Si . . . Processing." Proc. I.E.E.E. 57 (1969), 1469.

Implantations Ed. Dearnaley et al., North–Holland, 1973, p. 608 (See Shannon and Ford).

H. Ryssel, et al., "B. Doping Profiles and Annealing Behavior of Amorphous Implanted Si–Layers" in Ion–Impln. in Semiconductors & Other Materials, Ed. B. L. Crowder, Plemm Press, N.Y., 1972, p. 215.

*Primary Examiner*—L. Dewayne Rutledge
*Assistant Examiner*—Upendra Roy
*Attorney, Agent, or Firm*—Robert J. Wallace

[57] ABSTRACT

Boron implantation regions in <100> N-type silicon are subjected to a severe damage implant before anneal in a strongly oxidizing atmosphere that provides a passivating silicon dioxide surface layer. Diodes are formed having leakages as low as when such regions are annealed in other atmospheres or are formed in <111> silicon. In a preferred example, BF$_2^+$ is used to simultaneously implant boron into a region and convert it to amorphous silicon.

4 Claims, No Drawings

METHOD OF FORMING DIODES BY AMORPHOUS IMPLANTATIONS AND CONCURRENT ANNEALING, MONOCRYSTALLINE RECONVERSION AND OXIDE PASSIVATION IN <100> N-TYPE SILICON

BACKGROUND OF THE INVENTION:

This invention relates to implantation of boron into silicon and more particularly to a boron implantation method of making PN junctions on <100> N-type silicon crystal faces that permits anneal in a strongly oxidizing atmosphere to passivate the PN junction.

An N-type monocrystalline silicon surface can be doped to P-type conductivity by exposing the silicon to a beam of boron ions. Ordinarily, one uses an ion beam of the boron isotope $^{11}B$, the boron isotope having an atomic weight of eleven. After implanting a prescribed dose of the boron ions, the silicon is annealed. In annealing, crystal defects caused by the implantation are repaired, and the implanted boron atoms are moved to substitutional sites in the crystal lattice. In addition, annealing produces boron diffusion in the lattice. It can be done in reducing inert or oxidizing atmospheres. If done in a strongly oxidizing, i.e., moist oxygen atmosphere, it will also produce a passivating silicone dioxide coating over the silicon surface. If an island-like surface area of the N-type monocrystalline silicon was selectively implanted with boron, a surface intersecting PN junction will result. The silicon dioxide coating will quite effectively passivate this junction. Hence, where junction passivation is desired, it is desired to anneal in a strongly oxidizing atmosphere.

Implantation of $^{11}B$ in an island-like area on a <111> N-type silicon surface, followed by annealing in any of the usual atmospheres, including moist oxygen, will result in low leakage PN junctions. We have recognized that implantations of $^{11}B$ can be used to make low leakage PN junctions in <100> N-type silicon surfaces too, but only if the anneal atmosphere is not strongly oxidizing. Lowest leakage PN junctions are attained by $^{11}B$ implantations in <100> N-type silicon when the anneal atmosphere is neutral, as for example nitrogen or an inert gas, or only mildy oxidizing, as for example dry oxygen. If one wanted to passivate this PN junction on <100> silicon during anneal a strongly oxidizing, for example moist oxygen atmosphere might be used. However, as mentioned annealing the <100> silicon in strongly oxidizing atmosphere produced PN junctions with higher leakage. Thus, one had to be content with higher leakage PN junctions in boron implanted <100> N-type silicon, if moist oxygen passivation during anneal was desired. We have now found an implantation technique that permits such passivation without the higher PN junction leakage.

OBJECTS AND SUMMARY OF THE INVENTION

It is, therefore, an object of this invention to provide a new process of implanting boron on a <100> N-type silicon crystal face for making silicon dioxide passivated PN junctions.

Another object of this invention is to provide a new method of making lower leakage silicon dioxide passivated boron implanted PN junctions on <100> N-type silicon crystal surfaces.

These and other objects of the invention are obtained by implanting a conductivity inverting dose of boron into an island surface region on the <100> face N-type silicon monocrystal, severely damaging that same surface region by implantation of an electronically neutral atom, and annealing the monocrystal in a strongly oxidizing atmosphere. In a preferred method, $BF_2^+$ ions are implanted to simultaneously dope the region with boron and convert it to amorphous silicon. The $BF_2^+$ implanted monocrystal is annealed above about 900° C. in moist oxygen for a duration long enough to grow a 5000A° thick silicon dioxide coating on the silicon surface. During this anneal, the amorphous silicon epitaxially reconverts to monocrystalline silicon, boron atoms move to substitutional sites in the crystal lattice, and a silicon dioxide passivated PN junction of low leakage results.

Other objects, features and advantages of this invention will become apparent from the following description of the preferred embodiments.

DESCRIPTION OF THE PREFERRED EMBODIMENTS

Arrays of $1.14 \times 10^{-3}$ cm² circular diodes were fabricated in <100> and <111> oriented 1-2 ohm centimeter N-type polished silicon wafers. A silicon dioxide coating about 7,000 angstroms thick was thermally grown over the entire surface of the water on which the circular diodes were to be formed. The coating was grown in a manner that would provide effective masking (e.g. pin hole-free) of underlying silicon surface portions from ion beams to which the wafer was to be exposed. In this example the coating was formed by heating the wafers at 1100° C. for 70 minutes in oxygen. The oxygen was moist for the first 60 minutes and dry for the last 10 minutes of the treatment. The oxygen was moistened by bubbling it through hot water. The water was maintained at a temperature of 96° C.

The wafers were then photolithographically masked and immersed in buffered hydrofluoric acid for selective etching. A plurality of circular openings about 0.038 cm in diameter were etched in the silicon dioxide coating in a pattern of rows and columns. The openings were spaced about 0.1 cm apart in the rows and 0.1 cm apart in the columns. Thus, the coating had an array of openings within each of which the N-type polished silicon surface was exposed.

About one-half of the patterned surface of each wafer wax exposed to a $^{11}B$ ion beam of 50 keV at a rate of about 0.2 microamperes per square centimeter, in a dose of about $2 \times 10^{15}$ boron atoms per square centimeter. During this implant the second half of the patterned surface of some of the <100> and <111> N-type silicon wafers were also exposed to the $^{11}B$ ion beam and given the same $^{11}B$ implant. Other <100> and <111> N-type silicon wafers had the second half of the patterned surface isolated from the ion beam by mechanical masking. The unimplanted second half of the wafers was given a $3 \times 10^{15}$ atoms per square centimeter dose of 144 keV $BF_2^+$ at a rate of 2 microamperes per square centimeter.

Three <100> and three <111> N-type silicon wafers were implanted with $^{11}B$ across the entire patterned surface as described above. One half of the patterned surface of each of these latter wafers was given a damage implant. During the damage implant, the other half of the surface was protected by mechanical masking. One of each group of three wafers was given a damage implant of fluorine ion at 100 keV. A second was given a damage implant of neon ions at 100 keV. The third of each group was given a damage implant of argon ions at 144 keV. They were each given a dose of $3 \times 10^{15}$ cm$^{-2}$ to $1 \times 10^{16}$ cm$^{-2}$ at a rate of 1-2 microamperes per square centimeter.

The wafers were positioned at 7 degrees from normal to the ion beam during all implantations, as usual, to minimize channeling. At the energies described above, the BF$_2^+$ and the ions of $^{11}$B, fluorine, neon and argon will penetrate the <100> and <111> N-type silicon surface to about the same depth, with the $^{11}$B and BF$_2^+$ implants resulting in a PN junction about 2 micrometers below the silicon surface after anneal.

After implantation the wafers were annealed for 100 minutes at 1100° C. to activate and redistribute the boron. Annealing was done in a 5 cm diameter furnace tube through which flowed dry nitrogen, dry oxygen, or a strongly oxidizing atmosphere such as moist oxygen. By strongly oxidizing we mean an oxygen atmosphere having sufficient moisture added to it to grow at least about a 3,000, preferably 5,000, angstrom thick silicon dioxide layer on a clean silicon surface in about 100 minutes at about 1100° C. By a moist oxygen atmosphere, we mean one in which water is included in the anneal atmosphere for at least 50% of the anneal time, usually during only a middle portion of the anneal. It may be included up to 90% and even more of the anneal time if desired. Water is conveniently added to the anneal atmosphere by routing it through a water bubbler at 96° C. before it enters the anneal furnace. Further, the anneal atmosphere can be moistened by adding steam to it as it enters the anneal furnace. Still further, water can be included in the anneal atmosphere as a product of hydrogen and oxygen reaction. A typical rate of atmosphere flow through the water bubbler, as well as through the furnace, is about two liters per minute. For a furnace tube diameter of 5 cm, the atmosphere flow should be at least about 1.7 cm$^3$/sec. The strongly oxidizing atmosphere is which the wafers were annealed in the foregoing examples consisted of 30 minutes dry oxygen, followed by 60 minutes in moist oxygen, and then 10 minutes in dry oxygen. The oxygen was made moist by bubbling it through 96° C. water as previously mentioned. Such a treatment will grow a silicon dioxide coating about 5,000 angstroms thick in the 100 minutes treatment.

The <100> N-type silicon wafers having the BF$_2^+$ or the $^{11}$B implant plus the damage implant on their second halves, as well as a <111> wafer with only a $^{11}$B implant on both halves were each made in sets of three. One member of each set was annealed in dry oxygen, one in dry nitrogen and one in the sequentially dry-moist-dry oxygen atmosphere hereinbefore described.

The diodes were completed by photolithographically opening windows over each discrete diode implantation area. A discrete aluminum contact was deposited in the window over each diode by evaporation of aluminum. The wafers were then placed in a furnace at 500° C. for 10 minutes under an atmosphere of 4% by volume hydrogen and the balance nitrogen to sinter the evaporated aluminum, and provide a separate low resistance connection to each implanted diode area.

Diodes in the resulting arrays were probed with 80 volts reverse bias applied (V$_{BD}$ about 120 volts) and the leakage current was measured. All diodes in the <111> wafers and in the second half of the <100> wafers having the BF$_2^+$ implant or the $^{11}$B implant plus a damage implant had a fairly consistently low leakage current, averaging about $1 \times 10^{-9}$ amperes, regardless of the anneal atmosphere. The diodes on the first half of the <100> wafers had a similarly low average leakage current but only if annealed in dry oxygen or dry nitrogen. When the <100> wafer was annealed in the strongly oxidizing sequentially moist oxygen atmosphere, the first half diodes had an average leakage current of $1 \times 10^{-7}$ amperes.

A <100> N-type silicon wafer having BF$_2^+$ implanted diodes on the second half, and annealed in the sequentially dry-moist-dry oxygen atmosphere referred to, was tested at a variety of voltages. It was found that the BF$_2^+$ implanted diodes on the second half of this wafer had an I-V plot, where leakage current was the ordinate, that was substantially linear and had a nearly ideal slope of about 0.6 out to avalanche at about 100 volts. The $^{11}$B implanted diodes on the first half of the same wafer had an I-V plot that was linear up to almost 10 volts and had a slope of approximately 0.6. Hence, up to almost 10 volts the latter plot generally paralleled that of the BF$_2^+$ implanted diodes. However the leakage current was about two times higher than that of the BF$_2^+$ implanted diodes. Moreover, the $^{11}$B implanted diodes had a rather soft I-V curve. Slightly below about 10 volts, the leakage current started to increase geometrically. At 50 volts, the leakage current became almost two orders of magnitude higher than that of the BF$_2^+$ implanted diodes, whose leakage current was still linear and increasing only arithmetically.

Diodes from a $^{11}$B implant with an added damage implant of fluorine, neon or argon and also annealed in the strongly oxidizing, sequentially dry-moist-dry oxygen, atmosphere had leakage characteristics similar to those of the BF$_2^+$ implanted diodes. Hence, they had decidedly lower leakage characteristics than the $^{11}$B diodes without the damage implant. As mentioned, this is only true when the wafers were annealed in the strongly oxidizing atmosphere.

Strongly oxidizing atmospheres are used to grow passivating and masking oxides on silicon, particularly in integrated circuit processes. It is highly advantageous to produce this oxide growth during anneal after ion implantation. On the other hand, it is this type of anneal which produces high diode leakage. By this invention one can now attain both the advantage of oxide growth during anneal and the advantage of low leakage junctions.

We believe that the higher leakage currents previously exhibited by boron implanted diodes in <100> N-type silicon wafers that were annealed in strongly oxidizing atmospheres is due to gross dislocation defects in the monocrystalline silicon. Leakage current of diodes in the <111> silicon may be independent of anneal atmospheres because the defects lie in the <111> plane of the monocrystal. They do not intersect the PN junction as they do in the <100> silicon material. We have noted that many dislocation defects are at least about 4 micrometers in length, which is sufficient to penetrate a 2 micrometers deep PN junction in the <100> silicon. The excess leakage is probably due to strain introduced during the oxidation process or to metal oxide or silicon dioxide precipitated along the dislocations. Apparently, the presence of the amorphous surface layer during the subsequent anneal in a strongly oxidizing atmosphere inhibits the growth of dislocation defects in the implantation area, where they can contribute to junction leakage currents.

By analysis of scanning electron micrographs, we conclude that the additional implantation of fluorine, neon or argon is a damage implant that converts the implanted are to amorphous silicon after the $^{11}$B implantation. It appears the BF$_2^+$ implantation produces the same effect while simultaneously doping the silicon with boron. Thus, implantation of BF$_2^+$ is the same in effect as first implanting boron atoms and then irradiating the implanted region with neutral atoms. The damage is believed to be due to the heavier and larger size BF$_2^+$. At normal dose rates of about 1 microampere per square centimeter, a dose of at least about 3 × 10 ions per square centimeter is needed to obtain a significant reduction in leakage current. However, the dose appears to be slightly rate dependent. For example, in a cursory experiment it was found that diodes implanted with BF$_2^+$ in dose of only 2 × 10$^{15}$ ions per square centimeter but at a dose rate of 3 microamperes per square centimeter had significantly more leakage than diodes implanted with the same BF$_2^+$ at a rate of only 1 microampere per square centimeter.

The damage implant should at least be substantially coextensive with the doping implant. However, if it covers a greater area and/or depth, it is not believed to provide any increased benefits. The doping implant can be of any desired depth, usually ranging from 1600A to 4200A, and correspondingly at any desired energy, from 50 keV to 150 keV.

We claim:

1. A method of making a silicon dioxide passivated PN junction by boron ion implantation on a <100> silicon crystal face that has a reverse current leakage as low as a silicon dioxide passivated diode made by boron ion implantation on a <111> silicon crystal face, said method comprising the steps of:

implanting boron ions into a selected region of an N-type <100> monocrystalline surface of at least about 1 ohm-centimeter resistivity silicon in a predetermined dose that converts said selected region from N-type doping to a preselected P-type doping;

irradiating said selected <100> surface region with electronically neutral atoms in a dosage sufficient to convert said selected <100> surface region from monocrystalline silicon amorphous silicon; and without intervening anneal in a neutral atmosphere, heating said silicon to at least about 900° C. for a predetermined time in a moist oxygen atmosphere to grow a silicon dioxide coating thereon to a preselected thickness of at least about 3,000 angstroms on said <100> surface and to concurrently anneal said region, whereby said amorphous silicon in said region is epitaxially reconverted to monocrystalline silicon, boron atoms are moved to substitutional crystal lattice sites in the silicon to form a P-type zone therein, and a low leakage silicon dioxide passivated PN junction is formed between said P-type zone and N-type contiguous portions of said silicon.

2. A method of making a silicon dioxide passivated PN junction by boron ion implantation on a <100> silicon crystal face that has a reverse current leakage as low as a silicon dioxide passivated diode made by boron ion implantation on a <111> silicon crystal face, said method comprising the steps of:

implanting boron ions having an energy of at least about 50 keV into a selected region of an N-type <100> monocrystalline surface of at least about 1 ohm-centimeter resistivity silicon in a predetermined dose of at least about 3 × 10$^{15}$ atoms per square centimeter and which converts said selected region from N-type doping to a preselected P-type doping;

irradiating said selected <100> surface region with electronically neutral atoms in a dose that is precisely double the boron ion dose and converts the same selected <100> surface region from monocrystalline silicon to amorphous silicon; and thereafter heating said silicon to at least about 900° C. in a moist oxygen atmosphere to grow a silicon dioxide coating thereon to a preselected thickness of at least about 5,000 angstroms on said <100> surface and to concurrently anneal said silicon, whereby said amorphous silicon is reconverted to monocrystalline silicon of the same crystal lattice structure as the remainder of said silicone, boron atoms are moved to substitutional crystal lattice sites in the silicon to form a P-type zone therein, and a low leakage silicon dioxide passivated PN junction is formed between said P-type zone and N-type contiguous portions of said silicon.

3. A method of making a silicon dioxide passivated PN junction by boron ion implantation of a <100> silicon crystal face that has a reverse current leakage as low as a silicon dioxide passivated diode made by boron ion implantation on a <111> silicon crystal face, said method comprising the steps of:

irradiating a selected region on an N-type <100> monocrystalline silicon surface with BF$_2^+$ ions having an average energy of at least 50 KeV in a dosage of at least about 3 × 10$^{15}$ ions per square centimeter to convert said selected surface region simultaneously from N-type doping to P-type doping and to convert said region from monocrystalline silicon to amorphous silicon; and without intervening anneal in a neutral atmosphere, heating said silicon to a temperature of at least about 900° C. in a moist oxygen atmosphere to grow silicon dioxide thereon to a preselected thickness of at least about 3,000 angstroms on said <100> silicon surface and to concurrently anneal said region, whereby said amorphous silicon in said region is epitaxially reconverted to monocrystalline silicon and implanted boron atoms move to substitutional crystal lattice sites, resulting in a P-type monocrystalline zone in said N-type wafer surface and a silicon dioxide passivated low leakage PN junction therebetween.

4. A method of making silicon dioxide passivated PN junctions by boron ion implantation of a <100> silicon crystal face that has a reverse current leakage as low as oxide passivated diodes made by boron ion implantation on a <111> silicon crystal face, said method comprising the steps of:

irradiating selected regions on an N-type <100> surface of a monocrystalline silicon wafer with BF$_2^+$ ions having an average energy of at least about 50 keV in a dosage of at least about 2 × 10$^{15}$ ions per square centimeter at a dose rate of at least 1 microampere per square centimeter to simultaneously convert said selected surface regions to amorphous silicon and to P-type doping prominence; and heating said wafer to a temperature of about 1,000–1,200° C. for about 1–5 hours in a moist oxygen atmosphere to grow silicon dioxide thereon to a preselected thickness of about 3,000–5,000 angstroms on said <100> wafer surface and to concurrently anneal said wafer, during which said amorphous silicon is epitaxially reconverted to monocrystalline silicon and boron atoms therein to substitutional crystal lattice sites, resulting in P-type monocrystalline zones in said N-type wafer surface and low leakage silicon dioxide passivated PN junctions therebetween.

* * * * *

UNITED STATES PATENT AND TRADEMARK OFFICE
CERTIFICATE OF CORRECTION

PATENT NO. : 4,133,704
DATED : January 9, 1979
INVENTOR(S) : Bernard A. MacIver and Eugene Greenstein It is certified that error appears in the above—identified patent and that said Letters Patent are hereby corrected as shown below:

Column 1, line 27, "passivating silicone" should read -- passivating silicon --.

Column 3, line 39, "atmosphere is which" should read -- atmosphere in which --.

Column 5, line 10, "10 ions per square" should read -- $10^{15}$ ions per square --.

Column 6, line 12 (claim 2), "of said silicone," should read -- of said silicon, --.

Signed and Sealed this

First Day of May 1979

[SEAL]

Attest:

RUTH C. MASON
Attesting Officer

DONALD W. BANNER
Commissioner of Patents and Trademarks